(12) United States Patent
Bisges et al.

(10) Patent No.: US 8,763,680 B2
(45) Date of Patent: Jul. 1, 2014

(54) HEAT EXCHANGE FOR A THERMOELECTRIC THIN FILM ELEMENT

(75) Inventors: Michael Bisges, Sinzing (DE); Holger Albert Ulland, Willich (DE)

(73) Assignee: O-Flexx Technologies GmbH, Duisburg (DE)

( * ) Notice: Subject to any disclaimer, the term of this patent is extended or adjusted under 35 U.S.C. 154(b) by 866 days.

(21) Appl. No.: 12/988,441

(22) PCT Filed: Jun. 19, 2009

(86) PCT No.: PCT/EP2009/057692
§ 371 (c)(1),
(2), (4) Date: Oct. 18, 2010

(87) PCT Pub. No.: WO2010/006876
PCT Pub. Date: Jan. 21, 2010

(65) Prior Publication Data
US 2011/0030917 A1 Feb. 10, 2011

(30) Foreign Application Priority Data
Jul. 14, 2008 (DE) .................. 10 2008 032 856

(51) Int. Cl.
*H01L 35/20* (2006.01)
*H01L 35/30* (2006.01)

(52) U.S. Cl.
CPC .................. *H01L 35/30* (2013.01)
USPC .................................................. 165/58

(58) Field of Classification Search
CPC ................ H01L 35/20; F25B 29/00
USPC ............. 62/3.3, 3.7; 136/203, 204, 211, 212, 136/225; 165/58
See application file for complete search history.

(56) References Cited

U.S. PATENT DOCUMENTS

| 2,992,539 | A | * | 7/1961 | Curtis | 62/3.7 |
| 3,212,275 | A | | 10/1965 | Tillman | |
| 5,260,344 | A | * | 11/1993 | Ashida et al. | 521/131 |
| 6,855,880 | B2 | * | 2/2005 | Feher | 136/203 |
| 7,032,389 | B2 | * | 4/2006 | Cauchy | 62/3.3 |

(Continued)

FOREIGN PATENT DOCUMENTS

| DE | 101 22 679 | 12/2002 |
| DE | 10 2006 031164 | 1/2008 |
| EP | 1 287 566 | 3/2003 |

OTHER PUBLICATIONS

English Translation of International Preliminary Report on Patentability dated Feb. 10, 2011 issued in corresponding application No. PCT/EP2009/057692.

*Primary Examiner* — Frantz Jules
*Assistant Examiner* — Emmanuel Duke
(74) *Attorney, Agent, or Firm* — Lucas & Mercanti, LLP

(57) ABSTRACT

A heat exchanger for at least one thermoelectric thin film element, having a hot and a cold side arranged on opposite longitudinal sides of the thin film element. The hot side is connected to a coupling element on a warm source and the cold side is connected to a heat sink. The heat exchanger connects in a simple and active manner to the thermoelectric thin film element and improves the efficiency of the attached thermoelectric thin film element. Especially flexible thin film elements spread out between the coupling element and the heat sink of the heat exchanger and support the load between the coupling element and the heat sink by a thermally insulating support structure.

17 Claims, 4 Drawing Sheets

(56) References Cited

U.S. PATENT DOCUMENTS

| | | |
|---|---|---|
| 2003/0042497 A1 | 3/2003 | Span |
| 2003/0066554 A1 | 4/2003 | Feher |
| 2006/0151021 A1* | 7/2006 | Stark ............................. 136/205 |
| 2006/0181854 A1* | 8/2006 | Freedman ..................... 361/705 |
| 2007/0256427 A1 | 11/2007 | Tateyama et al. |
| 2009/0025771 A1 | 1/2009 | Stark |

* cited by examiner

HEAT EXCHANGE FOR A THERMOELECTRIC THIN FILM ELEMENT

PRIORITY CLAIM

This is a U.S. national stage of Application No. PCT/EP2009/057692, filed on Jun. 19, 2009, which claims priority to German Application No: 10 2008 032 856.1, filed: Jul. 14, 2008 the contents of which are incorporated herein by reference.

BACKGROUND OF THE INVENTION

1. Field of the Invention

The invention relates to a heat exchanger for at least one thermoelectric thin-film or thin layer element with a hot side and a cold side that extend along opposite long sides of the thin-film element, wherein the hot side is connected by a connecting element to a heat source and the cold side is connected to a heat sink.

2. Related Art

A thermoelectric generator can convert heat directly into electrical energy. Variously doped semiconductor materials are preferably used for this purpose, as a result of which efficiency can be significantly increased over that of thermocouples with two different metals connected to each other at one end. The thermoelectric generators available today, however, have relatively low efficiency. The standard semiconductor materials are $Bi_2Te_3$, PbTe, SiGe, BiSb, and $FeSi_2$ with efficiencies in the range of 3-8% To obtain sufficiently high voltages, several thermoelectric generators are connected electrically in series.

The way in which a thermoelectric generator works is based on the thermoelectric effect, referred to in the following as the Seebeck effect. The Seebeck effect refers to the production of an electrical voltage between two points of an electrical conductor or semiconductor which are at different temperatures. The voltage which occurs is determined by:

$$U_{Seebeck} = \alpha \cdot \Delta T$$

where:

$\Delta T$ is the temperature difference between the ends of the conductor/semiconductor or between the contact points; and $\alpha$ is the Seebeck coefficient or the so-called "thermoelectric power".

The Seebeck coefficient has the unit of an electrical voltage per temperature difference (V/K). The resulting voltage is independent of the ambient temperature and is dependent only on the temperature difference between the contact points. A thermoelectric generator of high efficiency is obtained in a material with a high Seebeck coefficient and with, at the same time, low resistivity and low thermal conductivity.

To increase the efficiency of a thermoelectric generator, a thermoelectric thin-layer element with at least one n-layer and at least one p-layer of a doped semiconductor has already been proposed in EP 1 287 566 B1, wherein the n-layer and the p-layer are arranged to form a pn-junction. The n-layer and the p-layer are contacted in an electrically selective manner. A temperature gradient is applied parallel to the boundary layer between the n-layer and the p-layer. The pn-junction is formed essentially along the entire the n-layer and p-layer, preferably along their longest dimension, and thus essentially along the entire boundary layer between them. As a result of the temperature gradient along the large pn-interface, a temperature difference develops between the two ends of a pn-layer package along this pn-junction of elongated form this temperature difference leads to a higher efficiency of the thermoelectric element than that known from the prior art, which comprises no temperature gradient along and within the pn-junction. The n and p-layers are contacted selectively either by producing an alloy in the contact areas and the associated pn-junctions or by direct contacting of the individual layers. The selective contacts are separate, that is, not conductively connected to each other, and are arranged on the p- and n-layers.

A thermoelectric thin-layer element with a support structure, on which several thermoelectric bars consisting of a first conductive material and several thermoelectric bars of a second conductive material are applied, is known from DE 10 2006 031 164. The first and second conductive materials have different conductivities, and the thermoelectric bars are electrically connected to each other such that two of them form a thermoelectric pair. The thermoelectric bars of the first and second conductive materials are arranged next to each other on the support structure. The cold side of the thermoelectric thin-layer element is located on one side of the electrically conductive first and second materials, and the hot side is located on the opposite side of the electrically conductive first and second materials.

A thermoelectric thin-layer element is known from DE 101 22 679 A1, which comprises a flexible substrate material, to which thin-layer thermoelectric pairs are applied. The thin-layer thermoelectric pairs are formed out of a material combination of two different materials. The first and the second material are arranged and thermally connected to each other such that, together, they form a thermoelectric pair. The two materials are printed onto the flexible film or deposited by conventional deposition methods. Strips of, for example, nickel as the first material and strips of chromium as the second material are arranged next to each other. The webs and strips are connected in pairs electrically to each other at their ends by a connecting structure of the second material. As a result of the connected webs and strips, a series circuit of several thermoelectric pairs is formed on a small surface. The large number of thin-layer thermoelectric pairs leads to a high output voltage of the thermocouple. The electrical connecting structures on the one side of the thermoelectric thin-layer element form its hot side, whereas the connecting structures on the opposite side of the thermoelectric thin-layer element form the cold side, wherein the hot side is connected by a connecting element to a heat source and the cold side to a heat sink.

SUMMARY OF THE INVENTION

One embodiment of the invention is based on creating a heat exchanger of the type indicated above that makes it possible to connect the exchanger simply and effectively to the thermoelectric thin-film element and improves the efficiency of the thermoelectric thin-film elements used. In particular, the heat exchanger is intended also to be suitable for accepting large thermoelectric thin-film elements, especially flexible ones.

According to one embodiment of the invention, the thin-film elements are spread out, especially flexible thin-film elements, between the connecting element and the heat sink of the heat exchanger and by using a support structure, especially a thermally insulating support structure, to absorb the loads between the connecting element and the heat sink.

For a heat exchanger of the type indicated above
the connecting element comprises at least two profiled sections with outside surfaces arranged parallel to each other, wherein the outside surfaces of adjacent profiled sections rest against both surfaces of the hot side of the thermoelectric thin-film element;

the heat sink comprises at least two profiled sections with outside surfaces arranged parallel to each other, wherein the outside surfaces of adjacent profiled sections rest against both surfaces of the cold side of the thermoelectric thin-film element;

the profiled sections of the connecting element and the profiled sections of the heat sink are arranged to form opposing pairs;

the outside surfaces of the pairs of opposing profiled sections of the connecting element and of the heat sink, i.e., the outside surfaces which rest against the thin-film element, are aligned with each other but are a certain distance apart; and the profiled section of the connecting element and the profiled section of the heat sink of each opposing pair are connected to each other by a support structure.

The connecting element is thermally insulated from the heat sink preferably in that the thermal conductivity of the material of the support structure is lower than that of the material of the profiled sections of the connecting element and of the heat sink. Additional insulation is achieved in that each opposing pair of connecting element and heat sink sections are connected to each other exclusively by the support structure, whereas the outside surfaces of the two opposing sections of each pair, i.e., the surfaces resting on the thin-film element, are a certain distance apart.

The effective thermal insulation between the connecting element and the heat sink leads to a high temperature difference between the hot and cold sides of the thin-film element and therefore to improved efficiency.

The heat exchanger according to one embodiment of the invention does not require support function from the thin-film element, which can therefore be spread out as a film of large surface area between the parallel outside surfaces of the connecting element and the parallel outside surfaces of the heat sink. To keep the thermoelectric thin-film element spread out, its long sides are clamped or adhesively bonded between the outside surfaces of adjacent parallel profiled sections. The heat exchanger therefore makes it possible to manufacture thermoelectric arrangements in which the preferably plate-shaped connecting element can be one or even several square meters in size.

The support structure preferably consists of a foam material, especially a polymer foam material, because of its low thermal conductivity and the absence of internal stresses. The cellular structure lowers the cross-sectional surface area available for heat transfer and thus reduces the thermal conductivity of the support structure with respect to that of the connecting element or heat sink, which are usually made of metal.

Materials and methods for the production of a foamed plastic with large porous cells are preferably used to reduce the thermal conductivity even more. If the foam is of the closed-cell type, the blowing agent used ($N_2/CO_2$) can be selected such that the thermal conductivity is further reduced.

Selecting a rigid foam, especially a rigid polyurethane foam, for the support structure ensures that the heat exchanger will have sufficient strength and stability.

When a support structure of foam material is used, the production of the inventive heat exchanger can be simplified by designing both the profiled sections of the connecting element and those of the heat sink as U-shaped sections, by arranging the outside surfaces of the flanges so that they are parallel to each other, and by arranging the flanges of opposing U-sections so that they face each other. The production of the heat exchanger can then be accomplished by first filling a conventional rectangular section with polyurethane foam. After the foam has cured, lengthwise slots are introduced through parallel side walls of the rectangular section, these slots extending down the entire length of the section, as a result of which the rectangular section is divided into two U-sections, wherein the flanges of the opposing U-profiles formed in this way face each other and are aligned with each other but are separated from each other by the longitudinal slot.

The mechanical connection between the two U-sections is accomplished by the foam section of rectangular cross section, which preferably extends down the entire length of the two U-sections. As a result, this support structure almost completely fills the two opposing U-sections of the connecting element on the one side and those of the heat sink on the other. At least two of the arrangements of profiled sections produced in this way are then arranged on a base, especially a flat plate, so closely together that the outside surfaces of adjacent U-sections rest on the hot or cold sides of the thin-film element.

The heat-conducting cross section of the support structure can be further reduced by introducing notches into the foam in the area of the gaps formed between the flanges of opposing U-sections, wherein the notches preferably extend down the entire length except for an area in the center, where material is left in place to form a web. Especially in the case of the previously explained method for the production of the U-sections from a rectangular section, the notches can be produced in the foam in the same step as that in which the rectangular profile is cut in two, namely, by allowing the cutting operation to continue to a certain depth into the cured foam material.

Alternatively or in addition, the heat-conducting cross section can be reduced by providing the support structure of foam with channels extending transversely to the longitudinal dimension of the sections. The number and arrangement of the channels and the formation of the notches in the foam material which may also be present are to be adapted to the required load capacity of the support structure.

If foam is not to be used for the support structure, the support structure is arranged in the area of the gaps formed between the flanges of opposing U-sections and is in particular formed by several connecting webs between two opposing U-sections. Under consideration of the required load capacity, the distance between the connecting webs should be maximized and the cross section of the connecting webs minimized to limit the transfer of heat. The connecting webs preferably consist of a material with a thermal conductivity lower than that of the U-sections. They can also consist of the material of the sections itself, however, although this leads to the formation of undesirable thermal bridges at the connecting points, which reduces the efficiency of the thin-film element or elements mounted on the heat exchanger.

To improve the efficiency even more by maintaining a higher temperature difference between the hot and cold sides of the thin-film element, cooling fins are arranged on the heat sink. The cooling fins increase the surface area of the heat sink and thus improve the dissipation of heat.

The connecting element preferably comprises a base on which the at least two sections, preferably several sections, are arranged. The hot side of the thin-film element is clamped and/or adhesively bonded between two adjacent sections. If more than two U-sections are arranged parallel to each other on the base, the U-sections enclosed between the U-sections on the outside serve to retain the thin-film elements on both sides.

To substantially guarantee high thermal conductivity and thus good absorption and dissipation of the heat, the connecting element and/or the heat sink comprise metal, ceramic, or a plastic with good thermal conductivity.

BRIEF DESCRIPTION OF DRAWINGS

The invention is explained in greater detail below on the basis of the exemplary embodiments:

FIG. 1a is a side view of an inventive thermoelectric arrangement;

FIG. 1b is a cross section through the arrangement of FIG. 1a along line A-A;

FIG. 1c is an enlarged view of detail "B" in FIG. 1a;

DETAILED DESCRIPTION OF THE DRAWINGS

Figure 1:
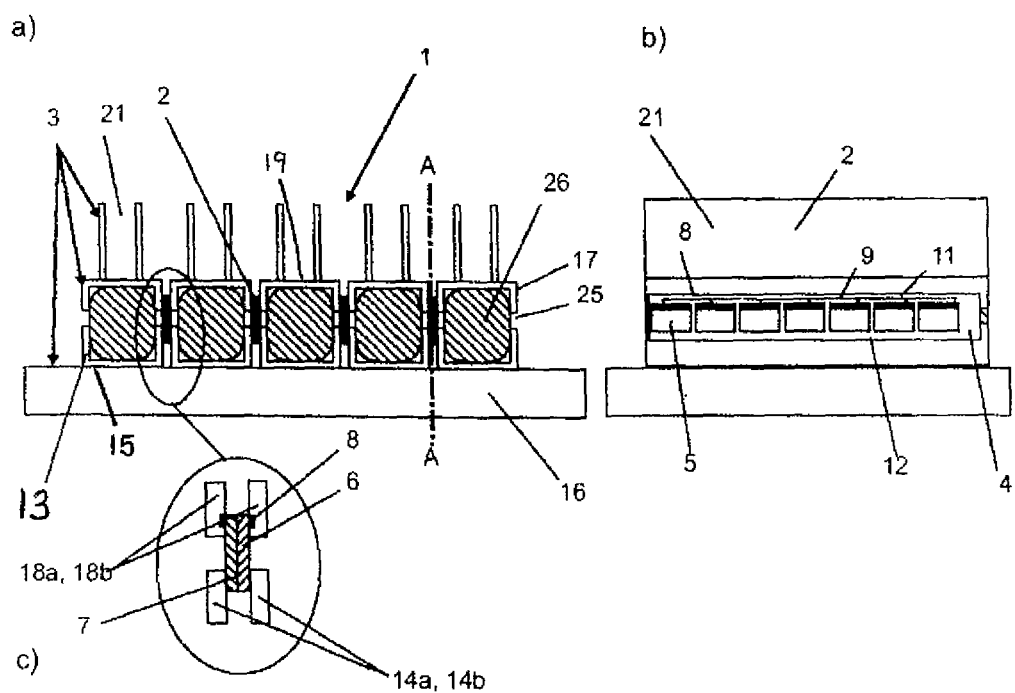

FIG. 1 is a thermoelectric arrangement in the form of a thermoelectric generator 1, which consists essentially of a thin-film element 2 and a heat exchanger 3. As can be seen in FIGS. 1b and 1c, the thin-film element 2 is formed by a flexible support film 4 in the form of a strip, on which are arranged several areas 5, consisting of first and second semiconductor materials 6, 7, which are electrically connected to each other. The areas 5 arranged next to each other in the longitudinal direction on the support film 4 are connected in series by the electrical thin-film contacts 8, 9 in alternation via the semiconductor material 6 and, on the opposite side, the semiconductor material 7. As a result of this series connection, the Seebeck voltages generated in the individual areas 5 of the thin-film element are added to each other.

The thermoelectric generator 1 comprises four thin-layer elements 2 arranged on support films 4, all of these elements in turn being connected in parallel.

On an edge of the support film 4 at the top in the figures is the cold side 11, and on the edge at the bottom in the figures is the hot side 12 of the thin-film element 2.

The hot side 12 of each thin-film element 2 is connected by a connecting element to a heat source (not shown in the figures). In the exemplary embodiment shown here, the connecting element comprises five U-sections 13 with webs 15 that connect the lateral flanges 14a, 14b to each other and rest on a flat plate 16 (FIG. 4b).

Figure 2:
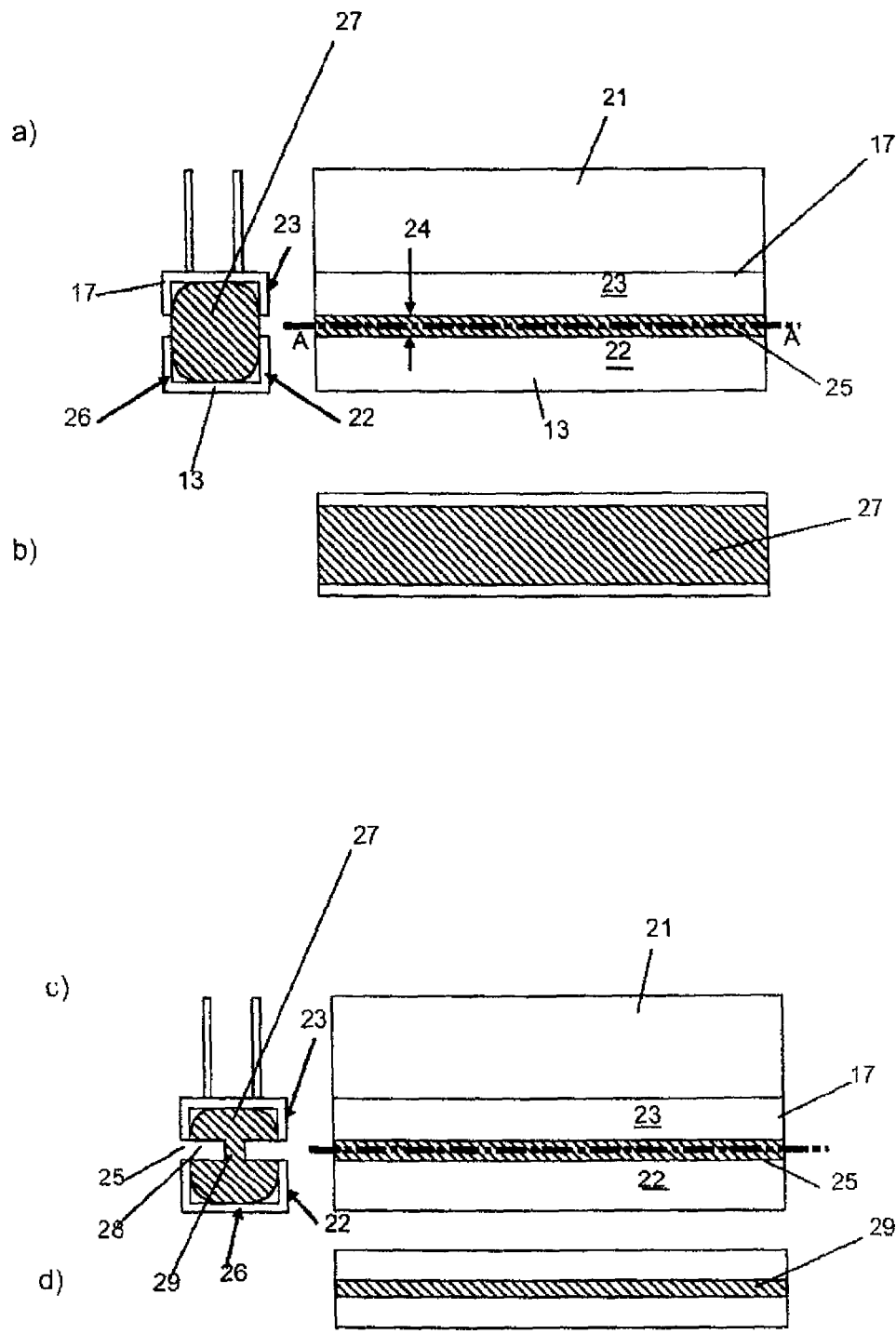
FIG. 2a is front and side views of an arrangement of the sections of a heat exchanger with two opposing U-sections and a support structure.
FIG. 2b is a cross section of the arrangement of sections according to FIG. 2a along line A-A.
FIG. 2c is front and side views of another arrangement of sections of a heat exchanger with two opposing U-sections and with a notched support structure.
FIG. 2d is a cross section through the arrangement of sections according to FIG. 2c along line A-A.

The cold side 11 of the thin-film element 2 is connected to a heat sink, which, in the exemplary embodiment shown here, comprises five U-sections 17 with downward-pointing flanges 18a, 18b, and vertically upward projecting cooling fins 21 arranged on the webs 19, which connect the flanges 18a, 18b. Both the flanges 14a, 14b of the U-sections 13 of the connecting element and the flanges 18a, 18b of the U-sections 17 of the heat sink are arranged with their outside surfaces 22, 23 parallel to the adjacent U-sections 13/17 of the connecting element and heat sink, shown in FIG. 2a.

Figure 3:
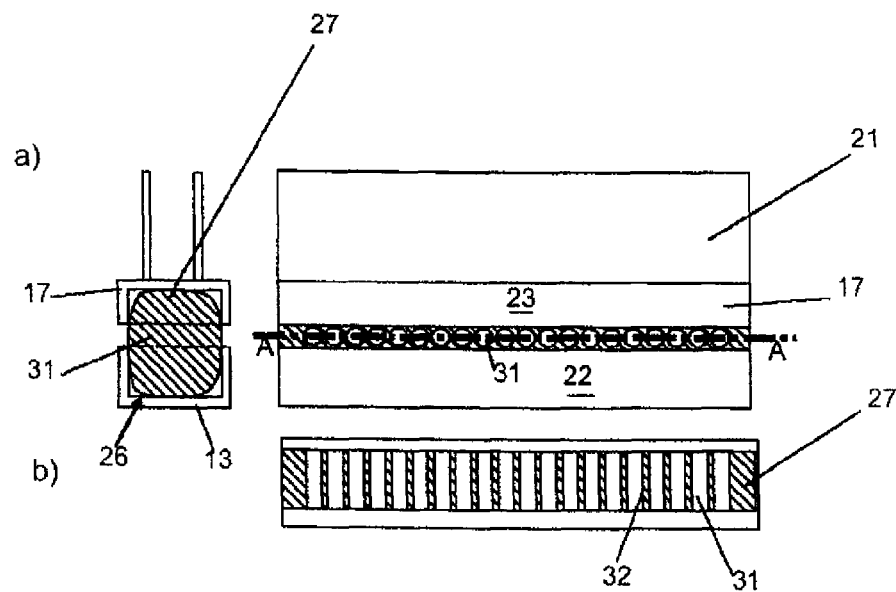
FIG. 3a is front and side views of another arrangement of sections of a heat exchanger with two opposing U-sections with a support structure comprising channels.
FIG. 3b is a cross section through the arrangement of sections according to FIG. 3a along line A-A.
FIG. 3c are front and side views of another arrangement of sections of a heat exchanger with two opposing U-sections, wherein the sections are connected to each other by webs.
FIG. 3d shows a cross section through the arrangement of sections of FIG. 3c along line A-A.
Figure 3:
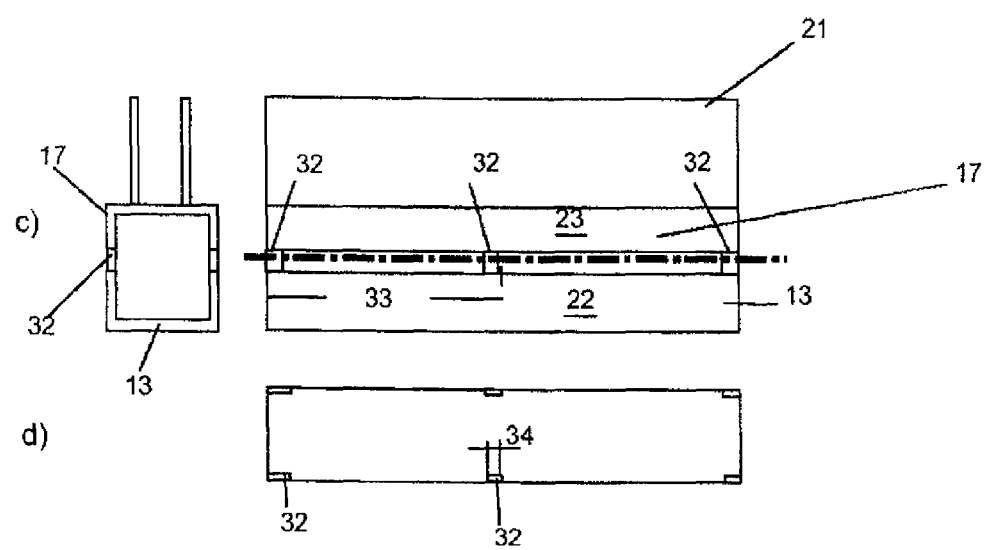

The outside surfaces 22 of two adjacent U-sections 13 of the connecting element preferably lie flush against both surfaces of the hot side 12 of the thermoelectric thin-film element 2. The distance between two adjacent U-sections 13 is selected so that the hot side 12 of the thin-film element 2 is clamped between the outside surfaces 22. An adhesive can be introduced between the outside surfaces 22 and the surface of the thin-film element 2. Opposite each of the U-sections 13 is one of the U-sections 17 of the heat sink. The flanges 14a, 14b and the flanges 18a, 18b of opposing U-sections 13, 17 face each other and are in alignment, but they are arranged a certain distance 24 apart, thus forming a gap 25, which can be seen especially clearly in FIGS. 2 and 3. The distance between two adjacent U-sections 17 of the heat sink is also selected in such a way that the cold side 11 of the thin-film element 2 is clamped between the outside surfaces 23. Here, too, an adhesive can also be introduced.

The lower U-sections 13 of the connecting element are connected to the upper U-sections 17 of the heat sink by a support structure 26. In the exemplary embodiment according to FIG. 1a, the lower U-sections 13 are connected mechanically to the upper U-sections 17 by a rigid foam section, which almost completely fills up the intermediate space between two opposing U-sections 13, 17. As can be seen especially clearly in FIG. 2b, the rectangular rigid foam section 27 extends an entire length of the U-sections 13, 17.

Gaps 25 between the lower and upper U-sections 13, 17 efficiently prevent a direct flow of heat between the connecting element and the heat sink via the sections 13, 17, which are firmly connected to each other mechanically by the thermally insulating rigid foam in the form of section 27. The cross-sectional surface which is active with respect to heat conduction is considerably reduced by the use of a rigid foam with large porous cells.

FIGS. 2c and 2d show a variation of the support structure 26, which comprises horizontal notches 28 in the rigid foam section 27 in the area of the gaps 25 between the flanges 14a, 14b and the flanges 18a, 18b; these notches extend as far as a centrally located web 29. The lower U-sections 13 and the upper U-sections 17 are connected to each other by the webs 29, which, in their totality, ensure sufficient stability of the support structure 26 formed by the rigid foam sections 27.

FIGS. 3a and 3b show a rigid foam section 27, in which the support structure 26 formed by the rigid foam profiled sections 27 is reduced by hollow cylindrical channels 31 extending transversely to the longitudinal dimension of the U-sections 13, 17. The webs 32 remaining between adjacent channels 31 give the support structure 26 formed by the rigid foam sections 27 sufficient stability.

FIGS. 3c and 3d, show a support structure 26 between opposing U-sections 13, 17 without an additional rigid foam section. In this embodiment, connecting webs 32 between two opposing U-sections 13, 17 form the support structure 26. Because of the considerable distance 33 between the connecting webs and their limited width 34, these webs do not form thermal bridges which could jeopardize the function of the thermoelectric arrangement, even though these connecting webs are made out of the same material as the heat sink and the connecting element. Preferably the connecting webs 32 are made out of a material with a thermal conductivity lower than that of the material of the connecting element and of the heat sink.

Figure 4:
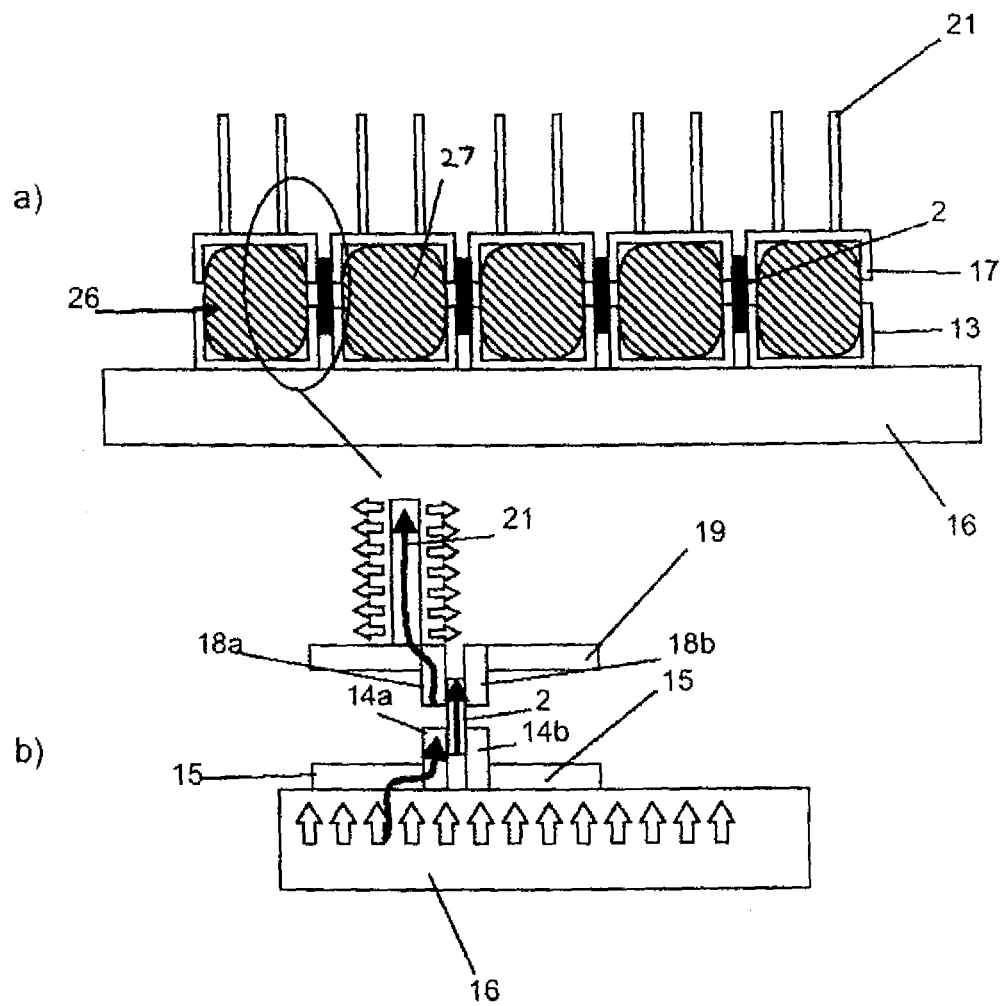
FIG. 4a is a side view of a thermoelectric arrangement.
FIG. 4b is a schematic diagram of an inventive thermoelectric arrangement to illustrate the flow of heat from the hot side to the cold side of the thin-film element.

FIG. 4 illustrates that, in the inventive thermoelectric arrangement, the thin-film elements 2 comprise thermal and electrical functions only, whereas the support function is provided exclusively by the thermally and electrically insulating rigid foam section 27. The heat flows from a heat source (not shown) connected to the plate 16, via this plate 16, through the webs 15 resting on the plate 16 and through the flanges 14 of the lower U-sections 13, through the thin-layer elements 2, and then, on the cold side 11 of the thin-film elements 2, through the upper U-sections 17 and the cooling sections 21, which are mounted on the webs 19 and which give off the residual heat to the surrounding air.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A heat exchanger comprising:
   at least one thermoelectric thin film element having opposing surfaces and a hot side and a cold side extending along opposing long sides of the at least one thermoelectric thin film element;
   a connecting element configured to connect the at least one thin film element to a heat source and including at least two profiled connecting element sections having substantially parallel outside connecting element surfaces, the outside connecting element surfaces of two adjacent ones of the at least two profiled connecting element sections abut the opposing surfaces at the hot side of one of the at least one thermoelectric thin film element so that the hot side is disposed therebetween;
   a heat sink including at least two heat sink sections having substantially parallel outside heat sink surfaces, the outside heat sink surfaces of two adjacent ones of the at least two heat sink sections abut the opposing surfaces at the cold side of the one of the at least one thermoelectric thin film element so that the cold side is disposed therebetween; and
   a support structure, the at least two connecting element sections and the at least two heat sink sections being connected by the support structure to form opposing pairs so that the outside connector element surfaces and the outside heat sink surfaces of each of the opposing pairs are aligned with each other and held a certain distance apart.

2. The heat exchanger according to claim 1, wherein the each of the at least two connecting element sections and the at least two heat sink sections are U-shaped sections with the respective parallel outside surfaces comprising flanges, the flanges of each of the opposing pairs of the at least two connecting element sections and the at least two heat sink sections are configured to face each other.

3. The heat exchanger according to claim 2, wherein the support structure substantially completely fills up an intermediate space between the two opposing ones of the U-shaped sections of each of the opposing pairs.

4. The heat exchanger according to claim 2, wherein the support structure comprises notches in area of the gap formed between the flanges of opposing U-shaped sections of each of the opposing pairs.

5. The heat exchanger according to claim 2, wherein the support structure comprises channels extending transversely to a longitudinal dimension of the U-shaped sections of each of the opposing pairs.

6. The heat exchanger according to claim 2, wherein the support structure is arranged in the area of the gaps formed between the flanges of the opposing U-shaped sections of each of the opposing pairs.

7. The heat exchanger according to claim 6, wherein the support structure is formed by at least one connecting web between two respective opposing U-shaped sections of each of the opposing pairs.

8. The heat exchanger according to claim 2, wherein the connecting element comprises a base on which the at least two connecting element sections are arranged.

9. The heat exchanger according to claim 8, wherein the base is configured as a plate on which webs of the U-shaped connecting element sections that connect the flanges rest.

10. The heat exchanger according to claim 1, wherein a thermal conductivity of the support structure is lower than a thermal conductivity of the at least two connecting element sections and the at least two heat sink sections.

11. The heat exchanger according to claim 10, wherein the support structure comprises foam.

12. The heat exchanger according to claim 11, wherein the foam is a closed-cell foam.

13. The heat exchanger according to claim 11, wherein the foam comprises a rigid plastic foam.

14. The heat exchanger according to claim 1, wherein a plurality of cooling fins are arranged on the heat sink.

15. The heat exchanger according to claim 1, wherein at least one of the connecting element and the heat sink comprises at least one of metal, ceramic, and plastic.

16. The heat exchanger according to claim 1, wherein the thermoelectric thin film element is clamped along its long sides between the outside connecting element surfaces of the adjacent ones of the at least two connecting element sections and between the outside heat sink surfaces of the adjacent ones of the at least two heat sink sections.

17. The heat exchanger according to claim 1, wherein the thermoelectric thin film element is adhesively bonded along its long sides to the parallel outside surfaces of the adjacent ones of the at least two connecting element sections and the at least two heat sink sections.

\* \* \* \* \*